(12) United States Patent
Hashimoto et al.

(10) Patent No.: US 8,197,704 B2
(45) Date of Patent: Jun. 12, 2012

(54) PLASMA PROCESSING APPARATUS AND METHOD FOR OPERATING THE SAME

(75) Inventors: Takahisa Hashimoto, Shunan (JP); Hideki Kihara, Kudamatsu (JP); Muneo Furuse, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 420 days.

(21) Appl. No.: 12/397,447

(22) Filed: Mar. 4, 2009

(65) Prior Publication Data

US 2010/0206845 A1 Aug. 19, 2010

(30) Foreign Application Priority Data

Feb. 16, 2009 (JP) ................................ 2009-032596

(51) Int. Cl.
*C03C 15/00* (2006.01)
(52) U.S. Cl. ...................... 216/67; 156/345.33; 118/715
(58) Field of Classification Search .......................... None
See application file for complete search history.

(56) References Cited

U.S. PATENT DOCUMENTS

| | | | | |
|---|---|---|---|---|
| 4,115,184 A | * | 9/1978 | Poulsen | 438/5 |
| 4,728,389 A | * | 3/1988 | Logar | 117/97 |
| 6,617,256 B2 | * | 9/2003 | Donohoe et al. | 438/710 |
| 6,764,572 B2 | * | 7/2004 | Shimizu et al. | 156/345.1 |
| 2004/0231798 A1 | * | 11/2004 | Gondhalekar et al. | 156/345.33 |

FOREIGN PATENT DOCUMENTS

JP 2005-216982 8/2005

OTHER PUBLICATIONS

Mar., AP-1000 Plasma System Operation and Maintenance Manual, 2001, March Plasma Systems, 1.2.1, 1.4.2, 3.1.1.*

* cited by examiner

*Primary Examiner* — Binh X Tran
*Assistant Examiner* — David Cathey, Jr.
(74) *Attorney, Agent, or Firm* — Antonelli, Terry, Stout & Kraus, LLP.

(57) ABSTRACT

The invention provides a plasma processing apparatus and a method for purging the apparatus, capable of preventing damage of components caused by pressure difference during purging operation of a vacuum reactor, and capable of preventing residual processing gas from remaining in the vacuum reactor. Inert gas is introduced through an inert gas feed port 233 on a side wall of a depressurized processing chamber (V1) 226 of a plasma processing apparatus, and the interior of the processing chamber (V1) 226 is brought to predetermined pressure by the inert gas, and thereafter, the inert gas is supplied to processing gas supply paths 213 and 216 (V2) communicated to a plurality of through holes 224 for introducing processing gas, so as to introduce the inert gas through the plurality of through holes 224 into the processing chamber (V1) 226.

3 Claims, 4 Drawing Sheets

PLASMA PROCESSING APPARATUS AND METHOD FOR OPERATING THE SAME

The present application is based on and claims priority of Japanese patent application No. 2009-32596 filed on Feb. 16, 2009, the entire contents of which are hereby incorporated by reference.

BACKGROUND OF THE INVENTION

1. Field of the Invention

The present invention relates to a plasma processing apparatus for supplying processing gas into a processing chamber arranged within a vacuum reactor and generating plasma so as to process wafers placed in the processing chamber, and after ending the process, supplying inert gas into the processing chamber and then opening the vacuum reactor to atmosphere.

2. Description of the Related Art

Plasma processing apparatuses such as semiconductor wafer processing apparatuses supply processing gas into a processing reactor depressurized to vacuum state (hereinafter referred to as a vacuum reactor) and forming plasma. Therefore, in order to perform maintenance of the interior of the vacuum reactor, it is necessary to return the interior of the vacuum reactor to atmospheric pressure before opening the reactor for maintenance.

One method for returning the pressure within the vacuum reactor to atmospheric pressure is to supply inert gas into the vacuum reactor and purging the interior thereof. Purging is a process of displacing the atmosphere within the reactor and pipes with inert gas, and for example, inert gas is supplied into an airtightly sealed reactor maintained in vacuum so as to displace the interior of the reactor with inert gas, to thereby raise the pressure within the reactor and to enable the reactor to be opened to the atmosphere. Furthermore, if hazardous gases or reactive gases exist in the reactor, the supply of inert gas into the reactor enables the atmosphere within the reactor to be displaced with inert gas, so that the hazardous gases and reactive gases in the reactor can be eliminated (removed) from the reactor.

Japanese patent application laid-open publication No. 2005-216982 (patent document 1) discloses such prior art method, wherein an inert gas supply pipe is connected between a processing gas supply source and a mass flow controller (MFC) for controlling the flow rate of the processing gas, so as to purge the MFC, the processing gas supply pipe and the interior of the processing chamber. Especially, the invention disclosed in patent document 1 is equipped with a sensor for detecting the processing gas concentration, aimed at achieving the object of determining the end of the purging operation by detecting the gas concentration within the processing chamber.

However, the aforementioned prior art plasma processing apparatus and the method for purging the same had the following drawbacks. Plasma processing apparatuses are equipped with a member having a plurality of small holes formed thereto (hereinafter referred to as shower plate) disposed between the processing chamber and the processing gas supply pipe for feeding the processing gas supplied from the processing gas supply source via the processing gas supply pipe uniformly in a dispersed manner into the processing chamber. The shower plate is formed of a dielectric member such as quartz for transmitting the electromagnetic waves radiated via the antenna from a high frequency power supply into the processing chamber. The processing chamber is separated into two chambers, a processing chamber and a thin clearance above the shower plate (on the gas supply side) via the shower plate.

Upon performing maintenance, when a purging operation using inert gas is performed through the processing gas supply pipe, since the conductance of the large number of holes on the shower plate is small, an excessive pressure difference occurs between the pressure in the thin clearance above the shower plate and the pressure in the processing chamber, by which the shower plate formed of a fragile material may be damaged.

In order to prevent damage of the shower plate, a method is adopted in which the inert gas is supplied through a side wall of the vacuum reactor and not through the processing gas supply pipe, but according to this method, the purging of the interior of the processing chamber can be performed sufficiently, and as mentioned earlier, since the diameter of the large number of holes on the shower plate is small and the conductance thereof is small, not enough inert gas will reach the thin clearance above the shower plate separated by the shower plate from the processing chamber or the processing gas supply path including the processing gas supply pipe, so that the purging operation becomes insufficient, and processing gas may reside in the processing gas supply path.

Moreover, since the purging of the processing gas supply path is insufficient, the processing gas supply path is at a state where the pressure is lower than atmospheric pressure or at negative pressure when the chamber is opened to the atmosphere, so that the processing gas supply path will suck in atmosphere when opened to the atmosphere, and the residual processing gas within the processing gas supply path and the moisture in the atmosphere will cause the corrosion of the processing gas supply path.

SUMMARY OF THE INVENTION

The present invention aims at solving the problems of the prior art by providing a plasma processing apparatus and the method for purging the same, capable of preventing the components from being damaged due to the pressure difference during purging operation of the vacuum reactor, and preventing processing gas from remaining within the vacuum reactor.

The present invention provides a plasma processing apparatus for processing a sample placed on an upper surface of a sample stage disposed in an interior of a processing chamber arranged in a vacuum reactor using plasma generated within the processing chamber, the apparatus comprising a plate member arranged on an upper surface of the processing chamber on an upper area of the sample stage having a plurality of through holes through which processing gas is introduced, an evacuation port arranged below the sample stage in the processing chamber for evacuating gas from the processing chamber, a pump arranged below the evacuation port in communication therewith for evacuating the interior of the processing chamber, and a supply path communicated with the through holes through which the processing gas is supplied, wherein an inert gas feed port is arranged on a side wall of the processing chamber for supplying inert gas into the processing chamber having been depressurized, and the apparatus further comprises a mechanism for supplying inert gas into the processing chamber through the inert gas feed port and also for supplying inert gas to the supply path of the processing gas.

Further, the present invention provides a method for operating a plasma processing apparatus for processing a sample placed on an upper surface of a sample stage disposed in an interior of a processing chamber arranged in a vacuum reactor using plasma generated within the processing chamber, the apparatus comprising a plate member arranged on an upper surface of the processing chamber on an upper area of the sample stage having a plurality of through holes through which processing gas is introduced, an evacuation port arranged below the sample stage in the processing chamber for evacuating gas from the processing chamber, a pump arranged below the evacuation port in communication therewith for evacuating the interior of the processing chamber, an inert gas feed port arranged on a side wall of the processing chamber for supplying inert gas into the processing chamber having been depressurized, and a supply path communicated with the through holes through which the processing gas is supplied, the method comprising supplying the inert gas into the supply path of the processing gas in a state where the inert gas is supplied into the processing chamber through the inert gas feed port, and introducing the inert gas into the processing chamber through the through holes.

The present invention enables to prevent damage of components of a vacuum processing apparatus caused by the pressure difference during purging operation of the vacuum reactor, and to prevent residual processing gas from remaining within the vacuum reactor.

DETAILED DESCRIPTION OF THE PREFERRED EMBODIMENTS

Now, the preferred embodiments for carrying out the present invention will be described with reference to the drawings.

[Embodiment 1]

Figure 1:
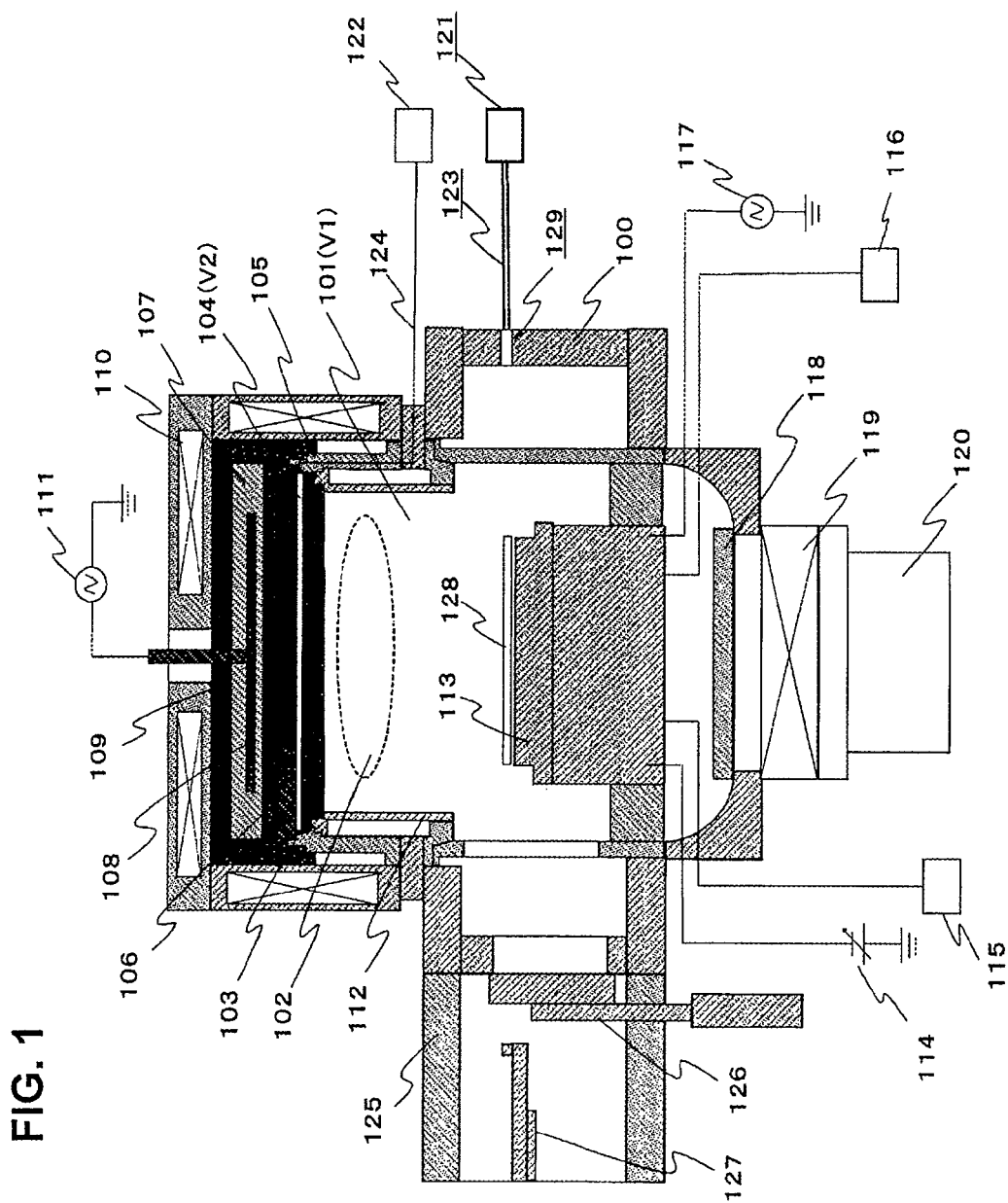
FIG. 1 is a vertical cross-sectional view showing the outline of the structure of a plasma processing apparatus according to embodiment 1 of the present invention.

FIG. 1 is a vertical cross-sectional view showing the outline of structure of the plasma processing apparatus according to embodiment 1 of the present invention. In the drawing, the operation of a high-frequency power supply 111, a DC power supply 114, an RF bias power supply 117, an evacuation gate plate 118, a conductance variable valve 119, an evacuation pump 120, a gate valve 126 and a transfer robot 127 are all respectively controlled via a controller not shown.

A processing chamber (V1) 101 is arranged within a vacuum reactor 100, on the upper portion thereof is disposed a disk-shaped antenna 108 for radiating electromagnetic waves into the processing chamber (V1) 101 and supplying electric field, and on the lower portion thereof is disposed a sample stage 113 for placing a board-shaped sample to be processed, such as a wafer 128, on the upper surface thereof. Further, on the side wall of the vacuum reactor 100 are disposed an inert gas supply source 121, an inert gas supply pipe 123 and an inert gas feed port 129 for purging the interior of the reactor.

Further, the vacuum reactor 100 comprises a gate valve 126 for opening and closing a path between the processing chamber (V1) 101 and a transfer chamber 125 having a transfer robot 127 for transferring the wafer 128 into the vacuum reactor 100, thereby communicating or disconnecting the two chambers.

A discharge chamber 102 is formed on the upper portion of the processing chamber (V1) 101. Further, on the upper portion of the discharge chamber 102 are disposed a top member 109 defining the top of the vacuum reactor, an antenna 108 disposed on the inner side of the top member 109, solenoid coils 110 arranged to surround the discharge chamber from the sides and above the antenna 108, and a ceiling member disposed below the antenna 108.

A high frequency power supply 111 for supplying high frequency in the UHF band or VHF band to the antenna 108 is arranged above the solenoid coils 110. The antenna 108 is disposed on the inner side of the top member 109 formed of conductive material. A dielectric 107 is disposed between the antenna 108 and the top member 109. The dielectric 107 insulates the antenna 108 and the top member 109, and transmits the electromagnetic waves radiated from the antenna 108 to the ceiling member disposed below.

The ceiling member comprises a quartz plate 106 formed of a dielectric such as quartz and a shower plate 103, wherein a thin clearance (V2) 104 is formed between the quartz plate 106 and the shower plate 103. A lower ring 105 is disposed below the top member 109 and on the outer circumference side of the quartz plate 106 and the shower plate 103. The lower ring 105 is provided with a gas passage for supplying processing gas into the thin clearance (V2) 104, and the processing gas is supplied from a processing gas source 122 through a processing gas supply pipe 124 and the gas passage in the lower ring 105 to the thin clearance (V2) 104. The processing gas supplied into the thin clearance (V2) 104 is fed in dispersed manner through a large number of small holes formed on the shower plate 103 into the processing chamber (V1) 101.

An inner wall member 112 of the discharge chamber is arranged below the shower plate 103. The inner side wall member 112 of the discharge chamber is arranged in contact with the lower ring 105 and the lower surface of the shower plate 103, facing the plasma generated in the vacuum reactor 100 and defining the discharge chamber 102.

The sample stage 113 disposed below the processing chamber (V1) 101 is cylindrical, and the upper surface of the sample stage 113 is covered with dielectric coating. A cylindrical or spiral-shaped flow path not shown is formed within the sample stage 113, and a refrigerant having its temperature or flow rate (flow speed) controlled via a temperature control unit 115 is introduced to the flow path, by which the temperature of the sample stage 113 is controlled.

The wafer 128 placed on the upper surface of the sample stage 113 receives heat input from the plasma, but by controlling the temperature of the sample stage 113, the temperature of the wafer 128 placed on the sample stage 113 can be controlled. Further, in order to improve the thermal conduction of the sample stage 113 and the wafer 128, a gas having thermal conductivity such as He is supplied from a thermal conductive gas supply source 116 to the space between the dielectric coating on the upper surface of the sample stage 113 and the rear surface of the wafer 128.

Further, the sample stage 113 is provided with a DC power supply 114 for electrostatically chucking the wafer 128 onto the sample stage 113, and an RF bias power supply 117 for accelerating ions toward the surface of the wafer 128 placed on the sample stage 113 during processing.

A space and an opening port is provided below the sample stage 113 for evacuating gas, plasma and reaction products from the processing chamber (V1) 101. The evacuation is controlled via the operation of an evacuation gate plate 118 for opening and closing the opening port, a conductance variable valve 119 disposed on the path communicated to the opening port, and an evacuation pump 120.

In such plasma processing apparatus, the wafer 128, which is the object to be subjected to a predetermined process, is placed on the transfer robot 127 with the gate valve 126 opened, transferred from the transfer chamber 125 into the vacuum reactor 100 and placed on the upper surface of the sample stage 113.

After the transfer robot 127 has moved to the exterior of the vacuum reactor 100, the gate valve 126 is closed, and the wafer 128 placed on the mounting surface on the upper surface of the sample stage 113 is chucked via electrostatic force and held to the position by the DC voltage from the DC power supply 114. In this state, He gas is supplied from the thermal conductive gas supply source 116 to the space between the dielectric coating on the upper surface of the sample stage 113 and the rear surface of the wafer 128 so as to cool the wafer 128.

Next, processing gas is supplied from the processing gas supply source 122 via the processing gas supply pipe 124 into the thin clearance (V2) 104, where it is supplied through the large number of small holes formed to the shower plate 103 into the processing chamber (V1) 101, and the electric field and magnetic field supplied via the antenna 108 and the solenoid coils 110 generate plasma by the processing gas, by which plasma is generated in the upper portion of the wafer 128. Further, a high frequency power is applied to the sample stage from the RF bias power supply 117, and the potential difference between the bias potential formed via RF bias on the upper portion of the upper surface of the wafer 128 and the plasma potential causes the ions within the plasma to be attracted toward the wafer 128, assisting the etching reaction and starting the process.

After the process is ended, the plasma and the RF bias are stopped, the supply of DC voltage from the DC power supply 114 is stopped, and the electrostatic force is reduced and eliminated. Thereafter, the gate valve 126 is opened, the processed wafer 128 is transferred out of the vacuum reactor 100 via the transfer robot 127, and after the transfer is completed, the gate valve 126 is closed again.

When performing cleaning or other maintenance of the interior of the vacuum reactor 100, it is necessary to return the inner pressure of the vacuum reactor 100 to atmospheric pressure to open the vacuum reactor 100 to the atmosphere, so that inert gas is supplied from the inert gas supply source 121 through the inert gas supply pipe 123 and into the vacuum reactor 100 via the inert gas feed port 129 on the side wall of the vacuum reactor 100, to thereby perform purging operation. The pressure inside the vacuum reactor 100 is detected via a manometer, and when the pressure within the reactor reaches atmospheric pressure, the supply of inert gas is stopped, and the reactor is opened to the atmosphere. Further, although not shown, it is possible to connect the inert gas supply pipe 123 to the processing gas supply pipe 124, so as to introduce the inert gas via the processing gas supply pipe 124 to the thin clearance (V2) 104, and to supply the inert gas through the large number of holes formed on the shower plate 103 into the processing chamber (V1) 101.

The purging operation is not only aimed at returning the interior of the vacuum reactor 100 to atmospheric pressure, but also at displacing the processing gas residing in the vacuum reactor 100 with inert gas and to remove the processing gas from the vacuum reactor 100. In order to remove the residual processing gas from the interior of the vacuum reactor 100 reliably, it is necessary to improve the displacement efficiency by inert gas, so a cycle purge is performed in which the process of purging performed in the same process as the above-mentioned purging operation and the process of evacuating the reactor via the evacuation pump 120 are repeated for a few times. After performing cycle purge, the purging operation is performed in the same manner as the above-mentioned purging operation, and when the inner pressure within the vacuum reactor 100 becomes equivalent to atmospheric pressure, the supply of inert gas is stopped and the reactor is opened to the atmosphere.

[Embodiment 2]

Figure 2:
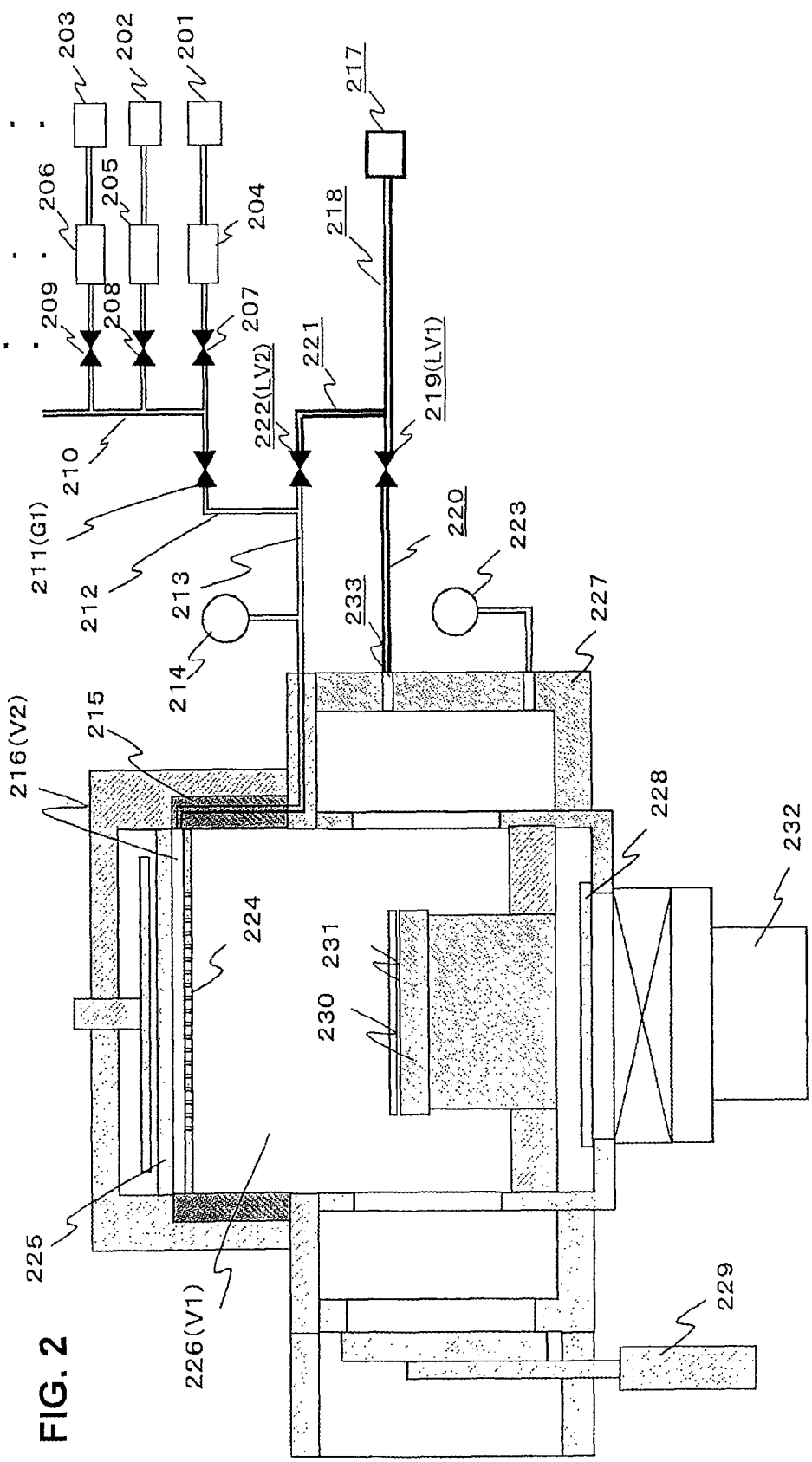
FIG. 2 is a view showing the arrangement of supplying processing gas and supplying inert gas into the plasma processing apparatus according to embodiment 2 of the present invention.

FIG. 2 is a view of embodiment 2 showing the arrangement of the processing gas supply path, the inert gas supply path and the inert gas feed port. The operations of MFCs 204, 205 and 206, valves 207, 208, 209, 211 (G1), 219 (LV1) and 222 (LV2), evacuation gate plate 228, gate valve 229 and evacuation pump 232 in the drawing are respectively controlled via a controller not shown.

The processing gas supply path includes respective processing gas supply sources 201, 202, 203 . . . , and MFCs 204, 205, 206 . . . and valves 207, 208 and 209 for controlling the flow rate of processing gases supplied form the supply sources. The processing gas supplied via the valves 207, 208, 209 . . . into the processing gas supply pipe 210 is fed via the processing gas supply pipe 212 and the processing gas supply pipe 213 into the vacuum reactor 227. A processing gas supply pipe 212 is equipped with a valve (G1) 211, and a processing gas supply pipe 213 is equipped with a manometer 214 for detecting the pressure within the processing gas supply path for detecting the inner pressure of the processing gas supply system.

Further, the term processing gas supply system refers to the processing gas supply path positioned toward the vacuum reactor 227 than the valve (G1) 211 and the valve (LV2) 222, which includes the thin clearance (V2) 216, the gas passage within the lower ring 215 and the processing gas supply pipes 212 and 213.

A gas passage is provided in the lower ring 215 disposed within the vacuum reactor 227, which supplies the processing gas introduced from the processing gas supply pipe 213 into the thin clearance (V2) 216 between the shower plate 224 and the quartz plate 225.

The inert gas supply path includes an inert gas supply source 217 and inert gas supply pipes 218 and 220 for introducing the inert gas supplied from the inert gas supply source 217 into the vacuum reactor 227, wherein the inert gas supply pipe 220 further comprises a valve (LV1) 219, for supplying inert gas through the inert gas feed port 233 on the side wall of the vacuum reactor 227. The above-mentioned inert gas can be, for example, nitrogen, argon or helium, and the method or flow rate for supplying the inert gas is not specifically defined. Further, the vacuum reactor 227 is provided with a manometer 223 for detecting the inner pressure of the processing chamber (V1) 226.

The supply path of inert gas includes a branched pipe 221 in the inert gas supply pipe 218, wherein by connecting the branched pipe 221 to the processing gas supply pipe 213, it becomes possible to purge the interior of the vacuum reactor 227 via inert gas through the processing gas supply path. Further, the branched pipe 221 is equipped with a valve (LV2) 222.

The supply of processing gas into the vacuum reactor 227 is performed in the state where a wafer 231 is placed on a sample stage 230. The processing gas supplied from the processing gas supply sources 201, 202, 203 . . . have their flow rates controlled via MFCs 204, 205, 206 . . . , and passes through the processing gas supply pipes 210, 212 and 213 via the valves 207, 208, 209 . . . and valve (G1) 211, into the gas passage of the lower ring 215 within the vacuum reactor 227.

At this time, the valve (LV1) 219 and the valve (LV2) 222 are closed, so that no processing gas flows into the inert gas supply path. The processing gas is supplied through the gas passage within the lower ring 215 into the thin clearance (V2) 216, and fed in a uniform and dispersed manner into the processing chamber (V1) 226 through the large number of holes on the shower plate. The processing gas supplied into the processing chamber (V1) 226 is turned into plasma, and the etching process is performed.

In order to open the vacuum reactor 227 to the atmosphere for maintenance, the interior of the vacuum reactor 227 must be purged via inert gas, and as for the steps of the purging operation, at first, inert gas is supplied from the inert gas feed port 233 on the side wall of the vacuum reactor 227.

Before starting to supply the inert gas, the valve (G1) is closed to stop the supply of processing gas. Further, the gate valve 229 and the evacuation gate plate 228 for opening and closing the evacuation port are closed to airtightly seal the vacuum reactor 227.

The inert gas supplied from the inert gas supply source 217 is supplied from the inert gas supply pipes 218 and 220 through the inert gas feed port 233 on the side wall of the vacuum reactor 227 into the vacuum reactor 227 with the valve (LV1) 219 opened and the valve (LV2) 222 closed, so as to start purging of the interior of the reactor. The inert gas flows into the processing chamber (V1) 226, and also into the thin clearance (V2) 216 through a large number of small holes on the shower plate 224.

The purging is continued in this state until the inner pressure of the processing chamber (V1) reaches pressure P1. Pressure P1 is a pressure lower than atmospheric pressure, which is set so that the pressure difference between the processing chamber (V1) 226 and the thin clearance (V2) 216 falls within a range so that the shower plate will not be damaged, and the pressure is detected via the manometer 223 for detecting the inner pressure of the processing chamber.

When the inner pressure of the processing chamber (V1) 226 has been raised to pressure P1, the valve (LV1) 219 is switched to "close" and the valve (LV2) 222 is switched to "open", and the purging through the inert gas feed port 233 on the side wall of the vacuum reactor 227 is ended, and thereafter, by introducing the inert gas to the branched pipe 221, the purging of the vacuum reactor 227 through the processing gas supply path is performed. Inert gas passes the processing gas supply pipe 213, is introduced through the gas passage in the lower ring 215 into the thin clearance (V2) 216, and supplied via the large number of small holes on the shower plate 224 into the processing chamber (V1) 226.

When the pressure within the processing chamber (V1) becomes equivalent to atmospheric pressure, the valve (LV1) 219 is set to "close" and the valve (LV2) 222 is set to "close", and the supply of inert gas is stopped, by which the purging operation is ended.

In order to positively remove the residual processing gas in the vacuum reactor 227 from the interior of the vacuum reactor 227, a cycle purge is performed in which the purging as described above with reference to the purging operation and the evacuation via the evacuation pump 232 are repeatedly performed for a few times. After performing cycle purge, a purging operation is performed via the same purging steps as described above, and when the pressure within the reactor becomes equal to atmospheric pressure, the supply of inert gas is stopped, and the reactor is opened to the atmosphere.

According to this purging operation, the pressure within the thin clearance (V2) 216 is raised after the pressure within the processing chamber has been raised, so that there is no fear of damage of the shower plate 224 caused by the pressure difference between the processing gas supply system and the processing chamber (V1) 226 during the purging operation, and by supplying inert gas through the processing gas supply path, no processing gas will remain within the processing gas supply path.

Furthermore, since the conductance of the large number of small holes on the shower plate 224 is small, inert gas will flow into the processing chamber (V1) 226 little by little through the large number of small holes on the shower plate 224 when inert gas is supplied through the processing gas supply path, so that when the pressure within the processing chamber (V1) 226 becomes equivalent to atmospheric pressure, the pressure of the processing gas supply system becomes higher than the pressure of the processing chamber (V1) 226, so that no atmosphere will be sucked into the processing gas supply system when the reactor is opened to the atmosphere, and corrosion of the pipes and the like can be prevented.

Figure 3:
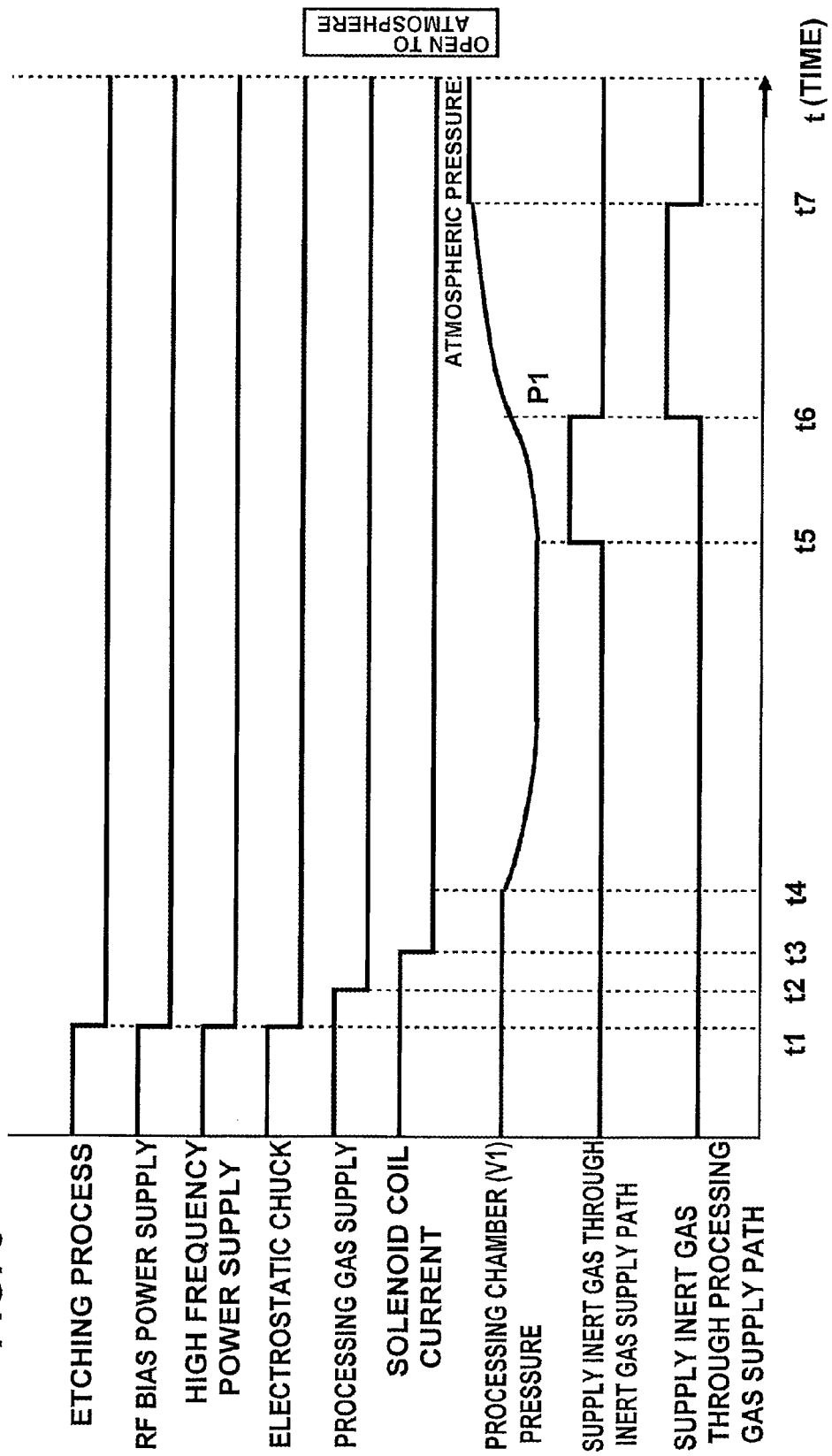
FIG. 3 is a time chart showing the flow of operation during maintenance after plasma processing.

FIG. 3 is a time chart showing the flow of operation during maintenance according to the embodiment illustrated in FIGS. 1 and 2.

When the etching process has been ended at time t1, the high frequency power applied to the sample stage 230 via the RF bias power supply 117 for accelerating ions in the plasma toward the surface of the wafer 231 placed on the sample stage 230, the high frequency supplied to the antenna 108 from the high frequency power supply 111 and the DC voltage of the DC power supply 114 for electrostatic chuck for supporting the wafer 231 on the sample stage 230 via electrostatic force are stopped.

Next, at time t2, the valve (G1) 211 disposed on the processing gas supply pipe 212 is closed to stop the supply of processing gas, and at time t3, the coil current of the solenoid coils 110 for generating a magnetic field in the processing chamber (V1) 226 is stopped. Further, at time t4, the processing gas and reaction products in the processing chamber (V1) 226 are evacuated by the operation of the evacuation gate plate 228, the conductance variable valve 119 and the evacuation pump 232, and the pressure within the chamber is reduced.

After evacuating the processing chamber (V1) 226, the gate valve 229 and the evacuation gate plate 228 for opening and closing the evacuation port are closed, so as to bring the vacuum reactor to an airtightly sealed state. Thereafter, at time t5, the valve (LV1) 219 disposed in the inert gas supply pipe 220 is set to "open", the valve (LV2) 222 disposed in the branched pipe 221 is set to "close", so as to supply inert gas through the inert gas feed port 233 on the side wall of the vacuum reactor 227 into the processing chamber (V1) 226 to start the purging operation. At time t6, when the pressure within the processing chamber (V1) 226 reaches pressure P1, the valve (LV1) 219 is switched to "close" and the valve (LV2) 222 is switched to "open", so as to supply inert gas into the branched pipe 221 and feed the inert gas through the processing gas supply path.

At time t7, when the pressure within the processing chamber (V1) 226 reaches a pressure equivalent to atmospheric pressure, the valve (LV1) 219 is set to "close" and the valve (LV2) 222 is set to "close", so as to stop the supply of inert gas and end the purging operation, and thereafter, the vacuum reactor 227 is opened to the atmosphere.

Figure 4:
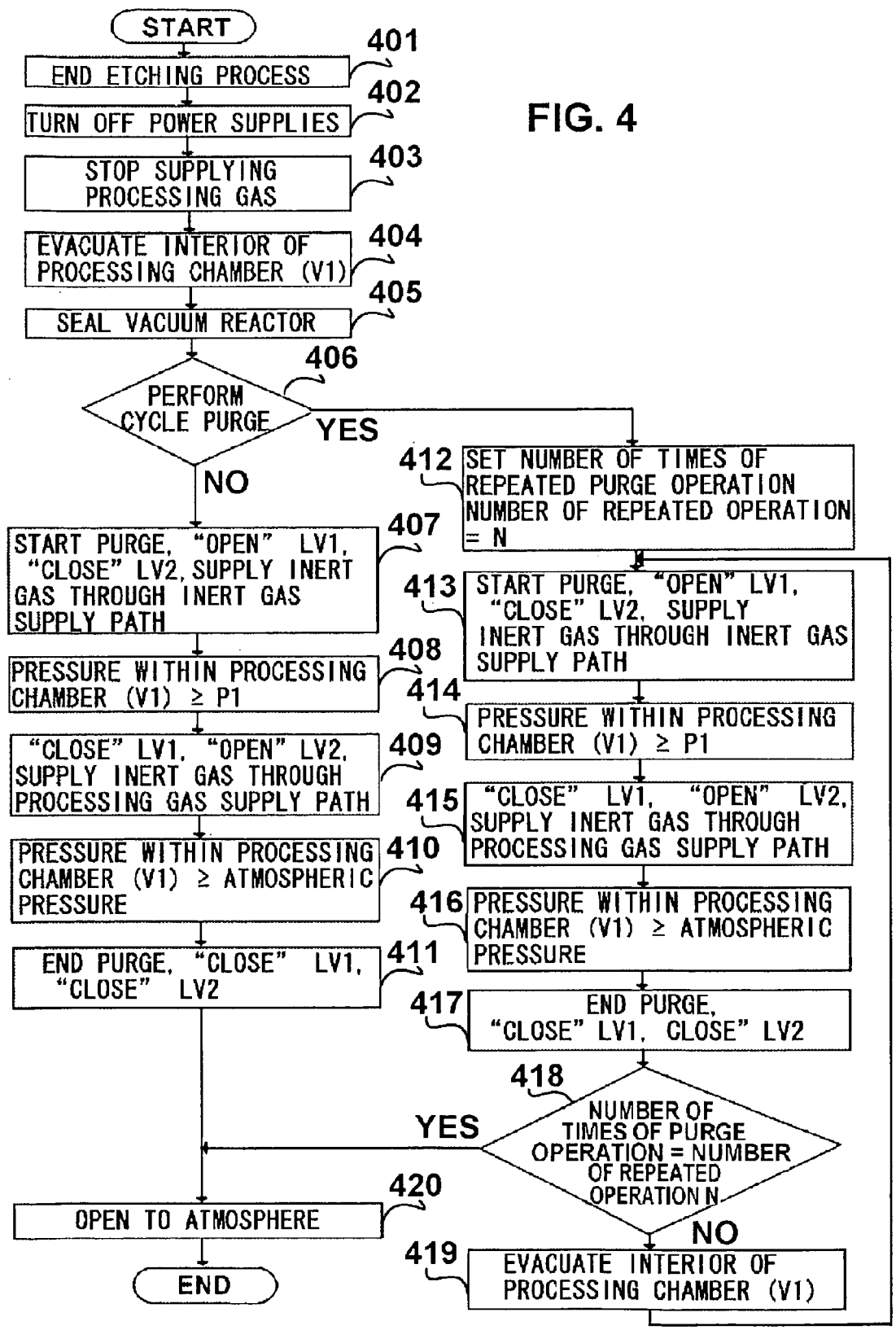
FIG. 4 is a flowchart showing the flow of operation during maintenance after plasma processing.

FIG. 4 is a flowchart illustrating the flow of the operation shown in FIG. 3. After the etching process is ended (step 401), the high frequency power by the RF bias power supply 117, the high frequency supplied to the antenna 108 from the high frequency power supply 111 and the DC voltage 114 for holding the wafer 128 on the surface of the sample stage 113 via electrostatic chuck are stopped (step 402).

The valve (G1) 211 disposed on the processing gas supply pipe 212 is closed, and the supply of processing gas is stopped (step 403). Simultaneously as stopping the processing gas, the processing gas and the reaction products in the processing chamber (V1) 226 are evacuated by the operation of the evacuation pump 232, and the processing chamber (V1) is brought to a vacuum state (step 404). After evacuation, the gate valve 229 and the evacuation gate plate 228 are closed, so as to bring the vacuum reactor 227 to an airtight state (step 405).

The steps subsequent to step 406 are divided into cases where cycle purge is performed and where cycle purge is not performed.

When cycle purge is not performed, the purging operation is performed only once by the following steps. At first, the valve (LV1) 219 disposed on the inert gas supply pipe 220 is set to "open" and the valve (LV2) 222 disposed on the branched pipe 221 is set to "close", and inert gas is supplied through the inert gas supply pipe 220 from the inert gas feed port 233 on the side wall of the vacuum reactor 227 into the processing chamber (V1) 226, so as to start the purging operation (step 407).

When the pressure within the processing chamber (V1) 226 has reached a pressure of P1 or greater (step 408), the valve LV1 is switched to "close" and the valve (LV2) 222 is switched to "open", so as to supply inert gas from the processing gas supply pipe 213 into the vacuum reactor 227 and to perform the purging operation (step 409).

When the pressure within the processing chamber (V1) 226 has reached a pressure equal to or greater than atmospheric pressure (step 410), the valve (LV1) 219 is set to "close" and the valve (LV2) 222 is switched to "close", so as to stop the supply of inert gas and to end the purging operation (step 411). After ending the purging operation, the reactor is opened to the atmosphere (step 420).

Next, the operation for performing cycle purge will be described. At first, the number of times for repeating the purging operation is set arbitrarily. In the present example, the number is set to n (step 412). The purging operation is performed in steps 413 through 417. The purging operation is performed via the same procedure (steps 407 through 411) as when cycle purge is not performed.

If the number of times of purging operation has not reached the repeat number n set in step 412 (step 418), the interior of the processing chamber (V1) 226 having been displaced with inert gas atmosphere by the purging operation is evacuated via the evacuation pump, by which the interior of the processing chamber (V1) 226 is brought to a vacuum state (step 419). Thereafter, the purging operation of steps 413 through 417 is repeatedly performed The purging operation and evacuation are repeatedly performed until the number of purging operations has reached the number n.

When the number of purging operations has reached the number n, the cycle purge is ended (step 418). After the cycle purge is ended, the reactor is opened to the atmosphere (step 420).

What is claimed is:

1. A method for operating a plasma processing apparatus configured to process a sample placed on an upper surface of a sample stage disposed in an interior of a processing chamber arranged in a vacuum reactor using plasma generated within the processing chamber, the plasma processing apparatus including a plate member arranged on an upper surface of the processing chamber above the sample stage having a plurality of through holes through which processing gas is introduced, an evacuation port arranged below the sample stage in the processing chamber for evacuating gas from the processing chamber, a pump arranged below the evacuation port in communication therewith for evacuating the interior of the processing chamber, an inert gas feed port arranged on a side wall of the processing chamber for supplying inert gas into the processing chamber having been depressurized, and a supply path communicated with the through holes through which the processing gas is supplied, the method comprising the following steps before a step of maintenance or cleaning of an inner surface of the processing chamber:

a step of supplying the inert gas through an inert gas feed port arranged on a side wall of the processing chamber into the processing chamber having been depressurized, so as to bring the processing chamber to a first pressure which is lower than a pressure of the atmosphere outside the vacuum reactor; and thereafter, a step of supplying the inert gas, while stopping the supply of the inert gas from the inert gas feed port, so as to introduce the inert gas through the through holes into the processing chamber.

2. The method for operating a plasma processing apparatus according to claim 1, further comprising:

a step of opening the interior of the processing chamber, after the step of introducing the inert gas through the through holes, and after the pressure within the processing chamber has reached a pressure equivalent to or higher than the pressure of the atmosphere outside the vacuum reactor.

3. The method for operating a plasma processing apparatus according to claim 1, further comprising:

a step of repeatedly performing, after processing the sample, an operation to evacuate the interior of the processing chamber through the evacuation port using the pump, and an operation to close the evacuation port to introduce inert gas through the inert gas feed port, and thereafter, introducing the inert gas through the through holes into the processing chamber.

* * * * *